(12) United States Patent
Nozawa et al.

(10) Patent No.: US 6,942,157 B2
(45) Date of Patent: Sep. 13, 2005

(54) DATA PROCESSING SYSTEM AND DATA PROCESSING METHOD

(75) Inventors: Tohru Nozawa, Sagamihara (JP); Yoshiharu Kato, Tama (JP)

(73) Assignee: International Business Machines Corporation, Armonk, NY (US)

( * ) Notice: Subject to any disclaimer, the term of this patent is extended or adjusted under 35 U.S.C. 154(b) by 206 days.

(21) Appl. No.: 10/241,979

(22) Filed: Sep. 11, 2002

(65) Prior Publication Data

US 2003/0052176 A1 Mar. 20, 2003

(30) Foreign Application Priority Data

Sep. 14, 2001 (JP) ........................................ 2001-279192

(51) Int. Cl.[7] .............................................. G06K 19/06
(52) U.S. Cl. ...................................... 235/492; 710/240
(58) Field of Search ................................. 235/492, 380, 235/472.02; 257/82, 84; 455/73, 74, 66, 90; 710/106–107, 117, 203, 240–244, 305; 397/135

(56) References Cited

U.S. PATENT DOCUMENTS

| | | | | |
|---|---|---|---|---|
| 4,438,491 A | * | 3/1984 | Constant | ..................... 710/106 |
| 4,850,044 A | * | 7/1989 | Block et al. | ................. 398/118 |
| 5,280,184 A | * | 1/1994 | Jokerst et al. | ................. 257/82 |
| 5,335,361 A | * | 8/1994 | Ghaem | ........................ 455/501 |
| 5,362,961 A | * | 11/1994 | Hamanaka | .................. 250/216 |
| 5,448,511 A | * | 9/1995 | Paurus et al. | ................. 365/52 |
| 5,621,913 A | * | 4/1997 | Tuttle et al. | ............... 455/41.2 |
| 5,686,714 A | | 11/1997 | Abe et al. | |
| 5,754,948 A | * | 5/1998 | Metze | ........................ 455/41.2 |
| 5,949,047 A | | 9/1999 | Abe et al. | |
| 6,263,193 B1 | * | 7/2001 | Iseki et al. | ..................... 455/84 |
| 6,542,720 B1 | * | 4/2003 | Tandy | ........................ 257/725 |
| 6,687,773 B1 | * | 2/2004 | Stewart et al. | ................. 710/65 |

FOREIGN PATENT DOCUMENTS

| | | |
|---|---|---|
| EP | 0 702 315 A2 | 3/1996 |
| EP | 0 702 315 B1 | 12/2001 |
| JP | 8-77317 | 3/1996 |

* cited by examiner

*Primary Examiner*—Diane I. Lee
(74) *Attorney, Agent, or Firm*—Arthur J. Samodovitz

(57) ABSTRACT

An IC chip is provided with a wireless unit for inputting and outputting data by wireless communication, in addition to a logic section, so that the IC chip no longer needs I/O pads, leaving only power supply and ground pads. IC chips can input and output data with one another by wireless communications, which makes it possible to significantly improve the spacing relationships of various chips on a singular or even plurality of substrates.

24 Claims, 7 Drawing Sheets

DATA PROCESSING SYSTEM AND DATA PROCESSING METHOD

FIELD OF THE INVENTION

The present invention relates to a data processing system and a data processing method implemented in a computer or the like.

BACKGROUND OF THE INVENTION

Advancements of submicron technologies in semiconductor manufacturing make it possible to form large-scale logic in a single IC chip. However, little progress has been made in a technique for reducing intervals between I/O (Input/Output) pads on the chip. This means that the size of the chip is determined by the number of I/O's rather than the number of logics. Even if a logic region occupies an extremely small portion of the entire chip, the die size cannot be reduced because of the need to maintain a predetermined number of I/O's, leading to an IC chip having a relatively small ratio of circuit area to total chip area.

On the other hand, the design concept of sharing a bus by various I/O's and devices has reached the limit in speeding up the system, and an attempt is being made to solve a problem regarding the bandwidth of the bus by adopting, for example, a crossbar switch system. However, the technique like the crossbar switch system results in forming too many pins, also leading to an IC chip having an extremely small ratio of logic area to total area.

Japanese Patent Publication No. 8-77317 discloses an IC chip with wireless communications capability incorporated in an IC card. The IC chip with the wireless communications capability incorporated in the IC card makes communications not with an IC chip that can be connected via wire, but with an access control system or a charging system, which inherently has a difficulty in establishing a wired connection. In other words, the technical idea of the wireless communications disclosed and suggested in Japanese Patent Publication No. 8-77317 merely chooses wireless communications as a communication function for an IC chip carried with an individual or mounted to a vehicle, and is, therefore, more or less the same as the technical idea of mobile communications with cellular phones or cordless phones.

Additionally, it has been known that an antenna is formed on the surface of the IC chip with wireless communications capability. Such an IC chip with wireless communications capability is also intended for incorporation into a card or a token (a round piece of metal used instead of coins in arcade games or the like), and wireless communications are disclosed or suggested, at best, as means for inputting and outputting data to and from the card or the token used as a mobile unit.

OBJECTS AND SUMMARY OF THE INVENTION

It is an object of the present invention to provide a data processing system and a data processing method having reduced IC chip sizes.

It is another object of the present invention to provide a data processing system and a data processing method for realizing a function similar to a bus connection among a plurality of IC modules without using a bus connection.

Most significantly, it is an object of the invention to provide such systems and methods in which the IC chips communicate with one another in a wireless manner.

A data processing system of the invention has a plurality of IC chips with wireless communications capability, each of which includes wireless communications input/output means for performing wireless data input and output and is allowed to input and output data with one another via the wireless communications input/output means.

The IC chips with wireless communications capability included in the data processing system are generally placed on a single substrate or disposed in a single computer, so that their relative locations are fixed. However, at least one of the IC chips with wireless communications capability may be disposed in a mobile unit, so that its relative location varies within a possible wireless communications range. The wireless communications medium is not limited to an RF electromagnetic wave, and it may involve light (including a laser beam), infrared rays, and/or other wireless communications media. In each IC chip with wireless communications capability, not all the I/O's are necessarily replaced with wireless communications. In other words, some I/O's of each IC chip with wireless communications capability may use wired communications as in the conventional IC chips. The IC chips with wireless communications capability may be mounted on separate substrates, respectively, rather than mounted on a single substrate. Some substrates may be coated with a grounding metal film on a particular surface almost entirely. In such a case, electromagnetic waves, which could otherwise pass through the substrate in a direction perpendicular to the substrate, are prevented from passing through the substrate. Therefore, it is preferable to take measures to, for example, distribute grounding metal films at adequate intervals so that a predetermined quantity of electromagnetic waves can pass through. When the data processing system is accommodated in an electromagnetic shield space, not only can irradiation of electromagnetic waves to the outside be prevented, but also security can be ensured. The number of electromagnetic wave frequencies used in the data processing system is not limited to one. By using a plurality of electromagnetic waves each having a different frequency, it is possible to allow more than one set or pair of IC chips to communicate simultaneously in the data processing system. In one example, a pair means two IC chips and a set means three or more IC chips.

The data processing system can be suitably applied to a conventional data processing system including master and slave IC's which are interconnected by a bus, and transmit and receive data via the bus. By changing data input and output performed via the bus to those performed by wireless communications, each IC module can be reduced in size. In this specification, an IC module includes an IC chip and an IC chip carrier such as a package incorporating the IC chip or a module substrate on which the IC chip is fixed. When a plurality of electromagnetic waves each having a different frequency are used in communications, it is possible to implement a plurality of communicating master/slave pairs in the data processing system, so that the system can operate at a higher speed without adopting the crossbar switch system.

The data processing system of the present invention may be featured as follows.

(a1) Each of the IC chips with wireless communications capability performs all data input and output via the wireless communications input/output means.

(a2) A plurality of IC modules, each containing the IC chips with wireless communications capability, are mounted on a single substrate. Further, these IC modules are placed on one surface or both surfaces of the substrate, and the substrate is provided with power supply and ground layers only, thereby omitting I/O wiring layers.

(a3) A plurality of IC modules, each containing an IC chip with wireless communications capability, are disposed in a single computer.

(a4) At least one of the IC chips with wireless communications capability includes wired communications I/O means for performing data input and output with other IC chips via wire, and is allowed to transmit and receive data with the other IC chips via the wired communications I/O means and wire.

(a5) A communications medium for the IC chips with wireless communications capability is an electromagnetic wave.

(a6) A plurality of IC modules, each containing an IC chip with wireless communications capability, are accommodated in a common electromagnetic shield space.

(a7) A communications medium for the IC chips with wireless communications capability is an RF electromagnetic wave, infrared rays, and/or a laser beam.

(a8) By allowing plural sets or plural pairs of IC chips with wireless communications capability to use electromagnetic waves with different frequencies, respectively, the plural sets or pairs can input and output data simultaneously. Further, the data processing system has a frequency-assigning IC chip with wireless communications capability for assigning frequencies of electromagnetic waves used when the IC chips with wireless communications capability input and output data with one another via the respective wireless communications I/O means.

(a9) The IC chips with wireless communications capability include a plurality of masters, at least one slave, and an arbiter, and each of the masters makes an arbitration request to the arbiter for communications involving transmission and reception of data with the slave prior to the communications.

The data processing system according to (a9) may be preferably arranged as follows.

Each of the masters is assigned with a unique frequency, and communicates with the arbiter by using an electromagnetic wave with the unique frequency. A master-slave frequency is set, and each of the masters is allowed to communicate with a desired slave by using an electromagnetic wave with the master-slave frequency. A plurality of different master-slave frequencies are set, and a plurality of master-slave pairs are allowed to communicate simultaneously by using electromagnetic waves with the respective master-slave frequencies. Also, the master-slave frequency is assigned as a master-unique frequency or a slave-unique frequency.

The data processing system of the present invention may further be featured as follows.

(a10) The IC chip with wireless communications capability is provided with an antenna connected to the wireless communications input/output means. Further, more preferably, the antenna is formed along a side edge of the IC chip, and the IC chip is mounted on a module substrate by a flip-chip BGA technique.

(a11) An antenna connected to the wireless communications I/O means is fixed to a package of the IC chip with wireless communications capability so as to protrude from the package in an exposed state.

(a12) The IC chip with wireless communications capability includes an antenna pad connected to the wireless communications input/output means, and an antenna standing upright is fixed to a substrate on which a module carrying the IC chip with wireless communications capability is mounted, and is connected to the antenna pad of the IC chip with wireless communications capability via a conductor on the substrate and a lead of the module.

(a13) The IC chips with wireless communications capability include a program memory chip storing various programs and a program executing IC chip capable of rewriting the programs, and loading from the program memory chip by wireless communications and then executing a necessary program. Further, the program memory chip stores programs that can be read out for executing interface functions between a CPU and respective peripherals, and the program executing IC chip performs data input and output with the peripherals by wireless communications and is allowed to load the program for executing the interface function between the CPU and the peripheral from the program memory chip.

According to a data processing method of the present invention, a plurality of IC chips with wireless communications capability each including wireless communications I/O means for performing wireless data input and output are prepared, and the IC chips with wireless communications capability are allowed to input and output data with one another via the wireless communications I/O means.

According to one aspect of the invention, there is provided a data processing system comprising a plurality of IC chips with wireless communications capability, each of which includes wireless communications input/output structure for performing wireless data input and output and is allowed to input and output data with one another via said wireless communications input/output structure.

According to a another aspect of the invention, there is provided a data processing method comprising the steps of preparing a plurality of IC chips with wireless communications capability each including wireless communications input/output structure for performing wireless data input and output, and allowing the plurality of IC chips with wireless communications capability to input and output data with one another via the wireless communications input/output structure.

According to yet another aspect of the invention there is provided a data processing method comprising the steps of preparing a program memory IC chip storing various programs, and a program executing IC chip capable of rewriting the programs, both of the IC chips including wireless communications capability with wireless communications input/output structure for performing wireless data input and out, and allowing the program executing IC chip to load from the program memory IC chip by wireless communications and then execute a desired program.

BEST MODE FOR CARRYING OUT THE INVENTION

The best mode of the present invention will now be described with reference to the accompanying drawings.

Figure 1:
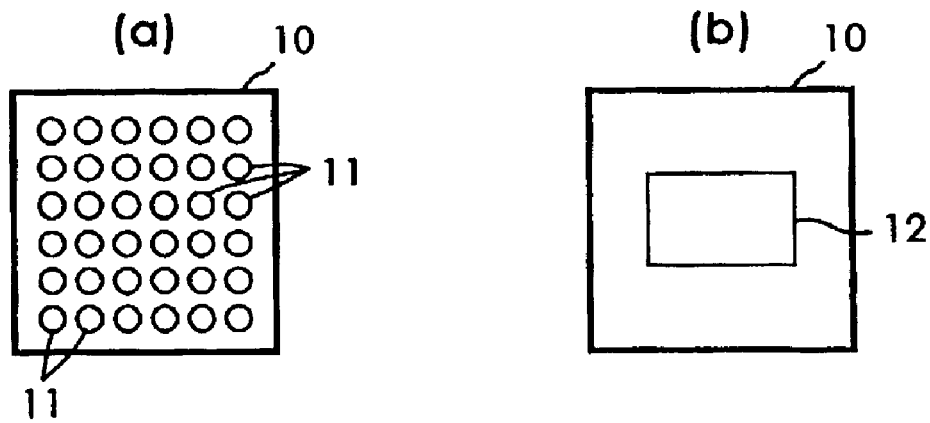
FIGS. 1(a) and 1(b) illustrate an IC chip having pads including I/O pads.
Figure 2:
FIGS. 2(a) and 2(b) illustrate an IC chip reduced in size by omitting the I/O pads from the IC chip of FIGS. 1(a) and 1(b)
Figure 3:
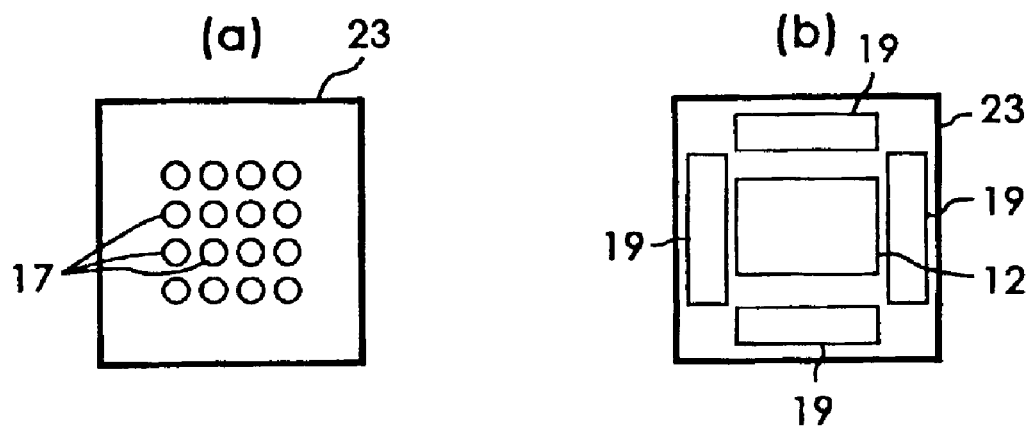
FIGS. 3(a) and 3(b) illustrate an IC chip omitting the I/O pads and having a plurality of wireless units.

FIGS. 1(a) and 1(b) illustrate an IC chip 10 having pads including I/O pads. IC chips 10, 16 and 23 shown in FIGS. 1(a), 1(b), 2(a), 2(b), 3(a) and 3(b), respectively, may be mounted on a substrate by direct mounting via solder bumps, or packaging with mold resin, or fixing to a module substrate. FIG. 1(a) shows a distribution of bonding pads 11 on IC chip 10, and FIG. 1(b) shows an area ratio of IC chip 10 and a logic section 12. Bonding pads 11 include pads connected to a VDD (power supply) and a GND (ground) in addition to the S/O pads. Bonding pads 11 are arranged in a grid form. Although the area of logic section 12 is small, the need to maintain all bonding pads 11 including the I/O pads makes it difficult to reduce the size of IC chip 10. Accordingly, an area ratio of logic section 12 to the surface area of IC chip 10 is relatively small.

FIGS. 2(a) and 2(b) illustrate an IC chip 16 reduced in size by omitting the I/O pads from IC chip 10. FIG. 2(a) shows a distribution of bonding pads 17 on IC chip 16, and FIG. 2(b) shows an area ratio of IC chip 16 to logic section 12. A wireless unit 19 is able to transmit and receive RF electromagnetic waves. Logic section 12 of IC chip 16 is identical with logic section 12 of IC chip 10. IC chip 16 omits all the I/O pads from bonding pads 11 shown in FIG. 11(a), so that bonding pads 17 include only the pads connected to VDD and GND. As a result, the size of IC chip 16 is reduced significantly in comparison with IC chip 10. Also, wireless unit 19 is formed on IC chip 16 together with logic section 12 instead of the omitted I/O pads. By having wireless unit 19 to do data input and output with other IC chips by means of an electromagnetic wave via wireless unit 19, it is possible to reduce the size of IC chip 16 by omitting the I/O pads.

FIGS. 3(a) and 3(b) illustrate an IC chip 23 made by omitting the I/O pads from IC chip 10 while providing a plurality of wireless units 19. FIG. 3(a) shows a distribution of bonding pads 17 on IC chip 23, and FIG. 3(b) shows the arrangement of wireless units 19 on IC chip 23. Logic section 12 and bonding pads 17 on IC chip 23 are identical with logic section 12 and bonding pads 17 on IC chip 16, and IC chip 23 is provided with four wireless units 19 around logic section 12. Since the areas of logic section 12 and wireless units 19 decrease as the submicron technologies advance, the die size can be reduced in accordance with such a decrease of the areas of logic section 12 and wireless units 19 if the need to maintain a certain number of pads is eliminated. Wireless units 19 are arranged in such a manner that they use different frequencies when operating at the same time, or each wireless unit 19 is allowed to switch to one of plural frequencies that is not being used by any other wireless unit. This arrangement enables IC chip 23 to communicate with up to four other IC chips (not shown) simultaneously. Alternatively, each wireless unit 19 may be used exclusively for communications with a particular correspondent, such as a memory or an interface, or for each function of logic section 12.

Figure 4:
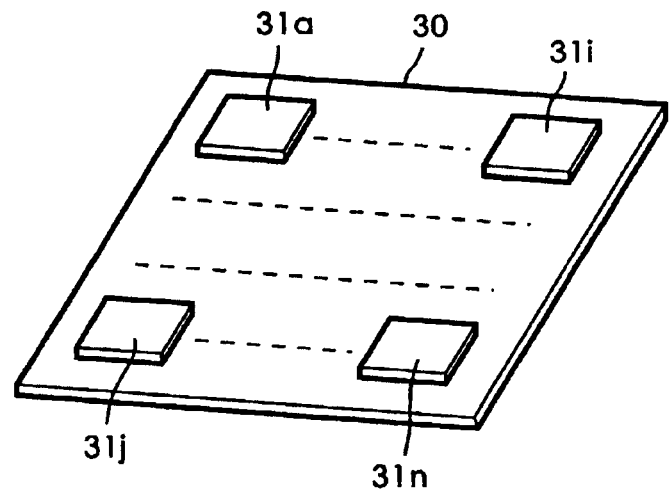
FIG. 4 is a perspective view schematically showing a substrate on which a plurality of IC modules with wireless communications capability are mounted.

FIG. 4 is a perspective view schematically showing a substrate 30 on which a plurality of IC modules with wireless communications capability 31a, 31i, 31j, 31n are mounted. Each of the IC modules with wireless communications capability 31a, 31i, 31j, 31n may be a ball grid array (BGA) which is a package containing an IC chip with wireless communications capability, such as the IC chip 16 shown in FIG. 2 or the IC chip 23 shown in FIG. 3. Not all the IC modules with wireless communications capability 31a, 31i, 31j, 31n are identical, and each is responsible for a function assigned in the system. Each of the IC modules with wireless communications capability 31a, 31i, 31j, 31n is arranged so that it inputs and outputs data (including program data and numerical value data) by means of RF electromagnetic waves. Accordingly, a higher degree of freedom is given as to the positions of the IC modules with wireless communications capability 31a, 31i, 31j, 31n on substrate 30 in comparison with IC modules interconnected via wires. By assigning a different frequency to each pair (2) of IC modules with wireless communications capability that are to start mutual data input and output, it is possible to allow a plurality of pairs to make communications simultaneously, thereby realizing communications at a higher speed. The IC modules with wireless communications capability 31a, 31i, 31j, 31n for performing data input and output by means of electromagnetic waves may be separately mounted on separate substrates (not shown) rather than all on single substrate 30. In such a case, electromagnetic waves from the IC modules with wireless communications capability 31a, 31i, 31j, 31n need to be irradiated not only in a planar direction of the substrates, but also in a direction perpendicular to the substrate's plane.

Figure 5:
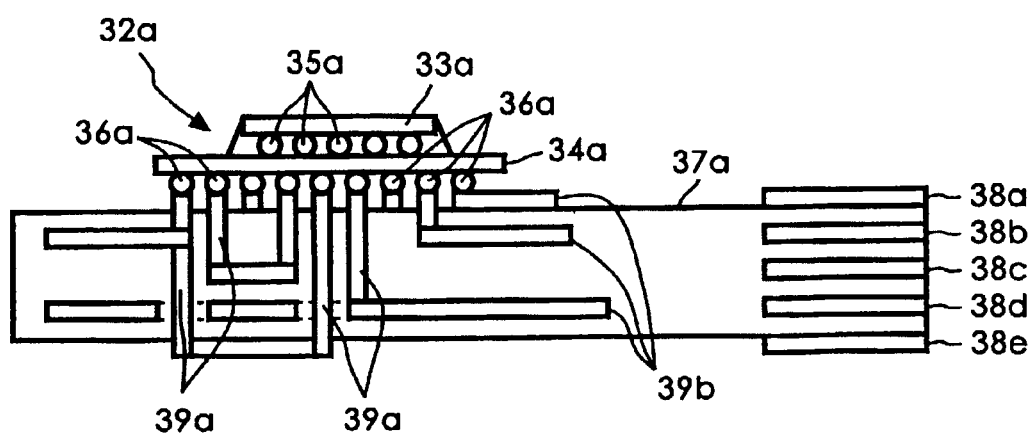
FIG. 5 is a cross-sectional view showing a structure of a substrate using an IC module carrying an IC chip with I/O pads.
Figure 6:
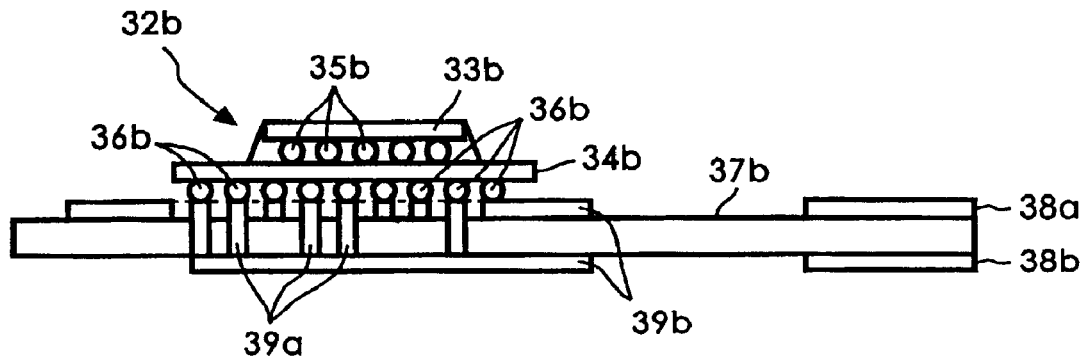
FIG. 6 is a cross-sectional view showing a structure of a substrate using an IC module carrying an IC chip with wireless communications capability.

FIG. 5 is a cross-sectional view showing a structure of a substrate 37a using an IC module 32a carrying an IC chip 33a with I/O pads. FIG. 6 is a cross section showing a structure of a substrate 37b using an IC module 32b carrying an IC chip 33b with wireless communications capability. IC chip 33a with I/O pads shown in FIG. 5 and IC chip 33b with wireless communications capability shown in FIG. 6 are illustrated as a conventional IC module and an IC module according to the present invention, respectively. Referring to FIG. 5, IC chip 33a with I/O pads is mounted on a module substrate 34a via bumps 35a by flip chip bonding, and module substrate 34a having a BGA lead structure is fixed to substrate 37a via leads 36a. Since IC chip 33a with I/O pads is not provided with a wireless unit, bumps 35a include I/O pads in addition to power supply and ground pads, and leads 36a include I/O leads in addition to power supply and ground leads. To avoid various I/O wires extended from the I/O leads of IC module 32a and power supply wires from getting crossed on substrate 37a, substrate 37a has a multilayer structure including five layers, i.e., a first layer 38a, a second layer 38b, a third layer 38c, a fourth layer 38d, and a fifth layer 38e from top to bottom. Substrate 37a is provided with a plurality of via holes 39a extending in its thickness direction, so that wires or conductors 39b of the respective layers are connected to the corresponding via holes 39a, whereby a plurality of IC modules 32a are interconnected via the via holes 39a and wires 39b without having the corresponding I/O's got crossed.

IC module 32b of FIG. 6 includes IC chip 33b with wireless communications capability and is mounted on module substrate 34b via bumps 35b by flip chip bonding, and module substrate 34b having a BGA lead structure is fixed to substrate 37b via leads 36b. However, in sharp contrast to IC module 32a, IC chip 33b with wireless communications capability is provided with a wireless unit, and therefore, bumps 35b include only power supply and ground pads, and leads 36b include only power supply and ground leads. As a result, the structure of substrate 37b can be simplified significantly. In other words, a plurality of IC modules 32b can input and output data to one another via the wireless unit in the respective IC chips 33b using wireless communication, which makes it possible to omit wires interconnecting the I/O leads of the respective IC modules 32b. Several modules 32b can be positioned on substrate 37b. Accordingly, substrate 37b no longer needs via holes and wires for transmission of I/O data among a plurality of IC modules 32b, and needs only via holes 39a and wires 39b for power supplying and grounding. As a result, the number of layers forming substrate 37b is reduced significantly, such that substrate 37b may be of only a double-layer structure having a first layer 38a and a second layer 38b as shown in FIG. 6. Further, it may even be of a single-layer structure. IC modules 32b may be placed in a concentrated manner on one surface of substrate 37b or distributed on both (upper and lower) surfaces of substrate 37b.

Figure 7:
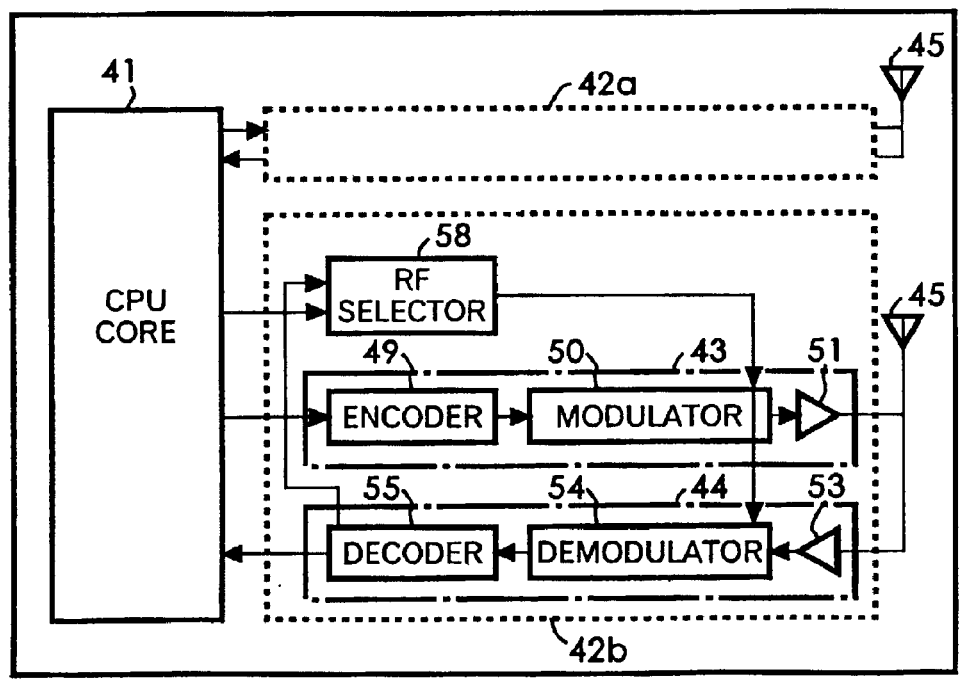
FIG. 7 illustrates an arrangement of a CPU chip having wireless units.

FIG. 7 illustrates a structure of a CPU chip 40 having wireless units. A CPU core 41 and two wireless units 42a and 42b are formed on CPU chip 40. Wireless units 42a and 42b are of the same basic arrangement, and FIG. 7 illustrates in detail the interior of wireless unit 42b alone for ease of illustration. Wireless unit 42b has a transmitter 43, a receiver 44, and an RF selector 58. Transmitter 43 includes an encoder 49 for encoding an output from CPU core 41 for outgoing transmission, a modulator 50 for modulating an output from encoder 49, and an amplifier 51 for amplifying an output from modulator 50. An antenna 45, which may be set up externally to CPU chip 40 instead of being provided in CPU chip 40 as shown, is connected to the output terminal of amplifier 51 and the input terminal of an amplifier 53. Receiver 44 includes amplifier 53 for amplifying a signal received from antenna 45, a demodulator 54 for demodulating an output from amplifier 53, and a decoder 55 for decoding an output from demodulator 54 and outputting the result to CPU core 41. The RF selector 58 adjusts a carrier frequency of modulator 50 and a detection frequency of demodulator 54 to frequencies it has selected from a plurality of preset frequencies based on a control signal from CPU core 41 or decoder 55. The modulation method in modulator 50 (demodulation method in demodulator 54) may be PM (Phase Modulation), AM (Amplitude Modulation), FM (Frequency Modulation), etc.

Figure 8:
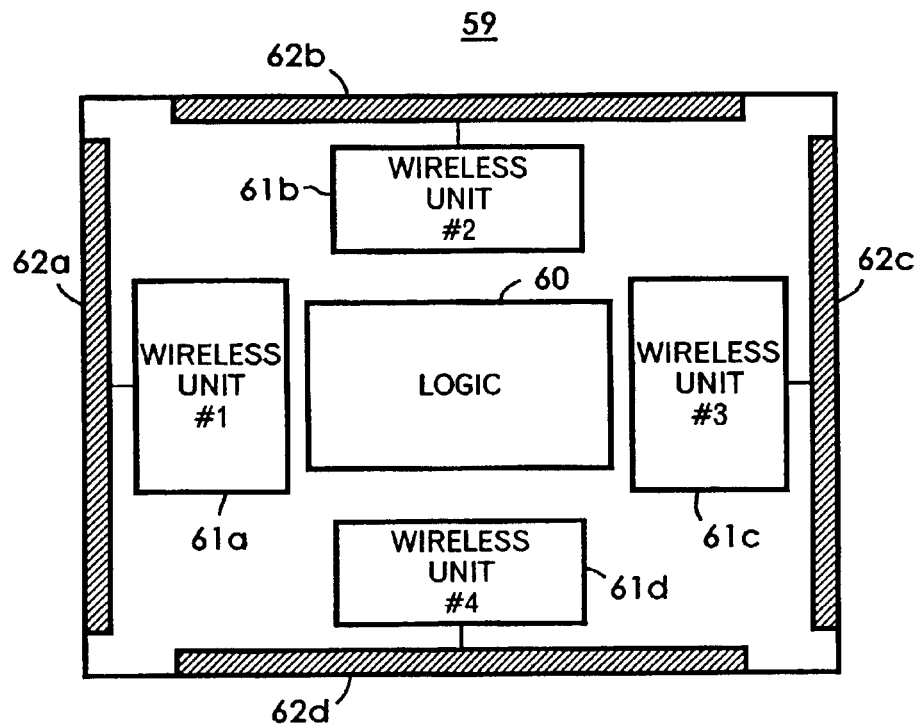
FIG. 8 illustrates an arrangement of an IC chip having antennas formed internally.

FIG. 8 illustrates a structure of an IC chip 59 having antennas formed internally. As with IC chip 23 shown in FIG. 3, a logic section 60 is placed at the center of IC chip 59, and four wireless units 61a, 61b, 61c, and 61d are placed around logic section 60. Antenna conductor films 62a, 62b, 62c, and 62d are formed along the edges on the four sides of IC chip 59 correspondingly to wireless units 61a, 61b, 61c, and 61d, respectively, and are connected to wireless units 61a, 61b, 61c, and 61d, respectively. Assume that the frequency of incoming and outgoing electromagnetic waves at the antenna conductor films 62a, 62b, 62c, and 62d is approximately 10 GHz, then the wavelength of the electromagnetic waves is approximately 3 cm. Accordingly, given ¼ of the wavelength of the incoming and outgoing electromagnetic waves is the length of antenna conductor films 62a, 62b, 62c, and 62d, then this length is only approximately 0.7 cm, which is small enough to be installed inside IC chip 59.

Figure 9:
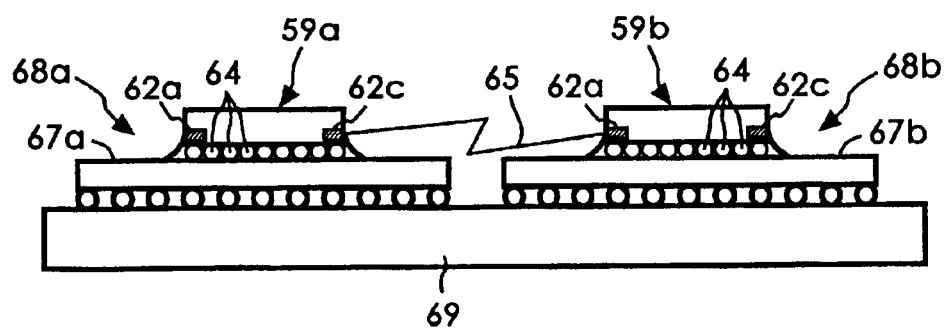
FIG. 9 illustrates a structure of IC modules made by mounting the IC chips of FIG. 8 on module substrates by flip chip bonding.

FIG. 9 illustrates a structure of IC modules made by mounting the IC chips of FIG. 8 on a module substrate 69 by flip chip bonding. IC modules 68a and 68b include IC chips 59a and 59b and module substrates 67a and 67b, respectively. IC chips 59a and 59b have the same structure as IC chip 59 of FIG. 8, and are provided with antenna conductor films 62a, 62b, 62c, and 62d. Also, they are mounted on module substrates 67a and 67b, respectively, via bumps 64 without being molded, that is, by the flip-chip BGA technique. According to the IC chip mounting structure of FIG. 9, antenna conductor films 62a, 62b, 62c, and 62d in each of the IC chips 59a and 59b are not molded, and they are formed at the side edges or ends of each of IC chips 59a and 59b. This arrangement is advantageous in that the radio wave intensity can be maintained by minimizing the adverse effects from the molding or the chips per se. Module substrates 67a and 67b are mounted on substrate 69 by the BGA technique. In FIG. 9, IC modules 68a and 68b input and output data mutually by means of electromagnetic waves 65 traveling between antenna conductor film 62c in the former and antenna conductor film 62a in the latter. For an IC module in which the resin of an IC chip equipped with antennas is molded and leads are connected to the pads of the IC chip by wire bonding, it is preferable to form the antennas on the inside of the bonding wire rather than at the ends of the IC chip.

FIGS. 10(a) and 10(b) illustrate a mounting structure of IC module 75 having an external antenna 79. FIG. 10(a) is a side view of the mounting structure and FIG. 10(b) is a plan view showing a part of an internal structure of IC module 75. Like IC chip 23 of FIG. 3, IC chip 70 has a plurality of wireless units (not shown). A bonding pad 71 is connected to the wireless unit, and a bonding pad 72 is used for VDD/GND. A conductor 76 is fully buried in IC module 75, and a lead frame 77 is buried in IC module 75 at one end, and extends to the outside of IC module 75 at the other end. Conductor 76 and lead frame 77 are connected to bonding pads 71 and 72 via bonding wires 78a and 78b, respectively. Antenna 79 is provided fixedly to touch conductor 76 at the bottom while standing upright to extend upward above IC module 75. The length of antenna 79 is approximately 0.7 cm like antenna conductor films 62a, 62b, 62c, and 62d shown in FIG. 8 whose length is also approximately 0.7 cm. IC module 75 has, for example, a flat pack type package, and is mounted on a substrate 81, after which it is fixed to a predetermined power supply line or ground line of substrate 81 at the end of lead frame 77. Antenna 79 extends perpendicularly with respect to substrate 81, so that an electromagnetic wave 80 irradiated from antenna 79 propagates efficiently in the planar direction of substrate 81. As was explained with reference to FIG. 4, the IC modules with wireless communications capability are generally mounted on a single substrate. Accordingly, it is more advantageous to irradiate an electromagnetic wave from each IC module with wireless communications capability in a direction parallel to substrate 81 than in a direction perpendicular to substrate 81.

Figure 10:
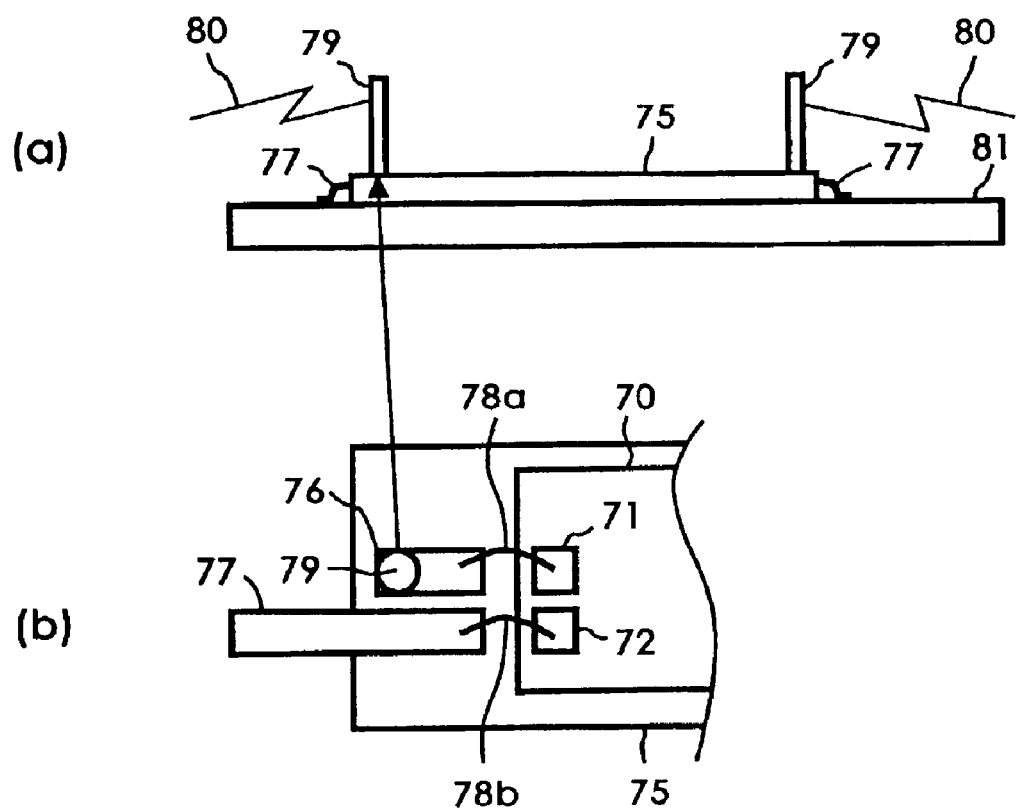
FIGS. 10(a) and 10(b) illustrate a mounting structure of an IC module having an external antenna.
Figure 11:
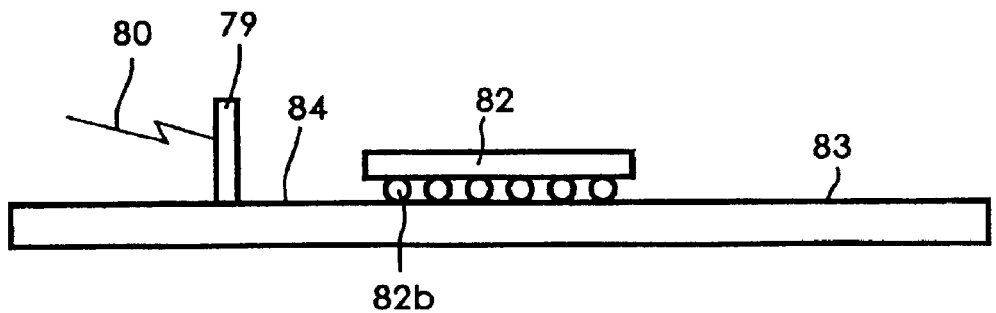
FIG. 11 illustrates a structure in which an antenna is positioned on a substrate.

FIG. 11 illustrates a structure in which antenna 79 is set up on a substrate 83. An IC module 82 of the BGA type has IC chip 70 (FIG. 10) provided with the wireless units. As shown in FIG. 10, IC chip 70 has bonding pad 71 to be connected to the external antenna, and therefore, it is connected to an external antenna lead 82b of IC module 82. Antenna 79 is fixed to substrate 83 at the bottom in close proximity to IC module 82, and stands perpendicularly with respect to substrate 83. A conductor 84 is formed on substrate 83 and connects the external antenna lead 82b to antenna 79. Antenna 79 serves as both a transmitter and a receiver for an electromagnetic wave 80.

Figure 12:
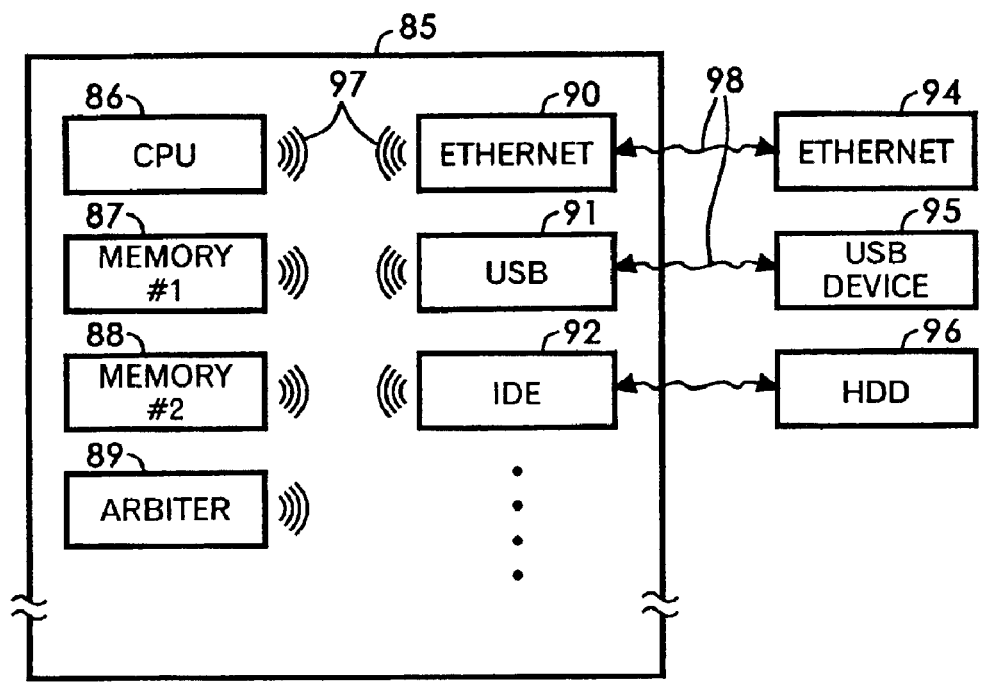
FIG. 12 illustrates a data processing system for inputting and outputting data by wireless communications instead of bus connections.

FIG. 12 illustrates a data processing system installed in a personal computer for inputting and outputting data by wireless communications instead of bus connections. A CPU module 86, memory modules 87 and 88, an arbiter module 89, an Ethernet module 90, a USB (Universal Serial Bus) module 91, an IDE (Integrated Drive Electronics) module 92, and other modules are mounted on a substrate 85. Each of these mounted modules has an IC chip with wireless communications capability like IC modules 31a, 31i, 31j, 31n with wireless communications capability shown in FIG. 4, and is allowed to input and output data with one another by means of electromagnetic waves 97. Ethernet module 90, USB module 91, and IDE module 92 transmit and receive data wirelessly not only to/from CPU module 86, etc. mounted on substrate 85, but also to/from an Ethernet 94, a USB device 95, and an HDD (Hard Disk Drive) 96 which are provided externally of substrate 85.

Figure 13:
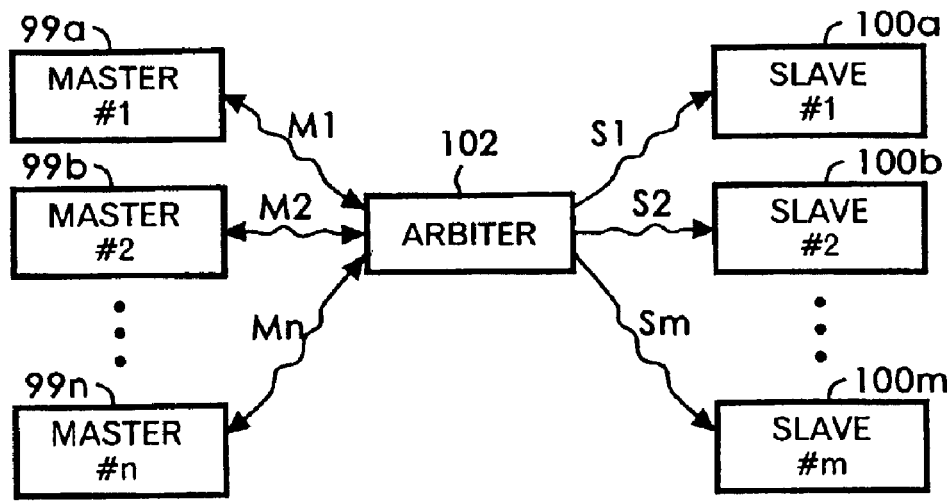
FIG. 13 illustrates assignment of frequencies in a multi-master/slave system.

FIG. 13 illustrates assignment of frequencies in a multi-master/slave system. Each of the CPU modules 86, memory module 87, etc. shown in FIG. 12 is referred to as either a maser or a slave shown in FIG. 13. In this case, CPU module 86, Ethernet module 90, USB module 91, and IDE module 92 are classified as masters, and memory modules 87 and 88 are classified as slaves. It should be appreciated, however, that Ethernet module 90 and USB module 91 classified as masters in this example may be classified as slaves in other examples. Frequencies M1, M2, Mn and S1, S2, Sm, which are different from one another, are assigned uniquely to the masters 99a, 99b, 99n and the slaves 100a, 100b, 100m, respectively. Masters 99a, 99b, 99n and the slaves 100a, 100b, 100m use electromagnetic waves with their unique frequencies M1, M2, Mn and S1, S2, Sm when communicating with the arbiter 102. More specifically, when each of masters 99a, 99b, 99n is trying to access a particular slave, it makes an arbitration request to arbiter 102 and later receives a notice from arbiter 102 as to whether an access is permitted or denied. Such arbitration request and notice of access permission or denial are transmitted between masters 99a, 99b, 99n and arbiter 102 using electromagnetic waves with the frequencies uniquely assigned to masters 99a, 99b, 99n. On the other hand, arbiter 102 notifies one of slaves 100a, 100b, 100m of the ID of the master to which an access to that slave is permitted and the frequency of an electromagnetic wave on which data is inputted and outputted wirelessly with the notified master. This notification is made using an electromagnetic wave with one of the frequencies S1, S2, Sm uniquely assigned to that slave. A master and a slave communicate by using a frequency C selected from (a) one of the frequencies M1, M2, Mn uniquely assigned to the master involved in the communication, (b) one of the frequencies S1, S2, Sm uniquely assigned to the slave involved in the communication, and (c) one or more frequencies D1, D2, which are different from M1, M2, Mn and S1, S2, Sm and also different from one another. In the case of (a), each slave should be able to transmit and receive not only an electromagnetic wave with its unique frequency, but also electromagnetic waves with the frequencies uniquely assigned to all the masters. In the case of (b), each master should be able to transmit and receive not only an electromagnetic wave with its unique frequency, but also electromagnetic waves with the frequencies uniquely assigned to all the slaves. In the case of (c), each of the masters and slaves should be able to transmit and receive not only an electromagnetic wave with its unique frequency, but also electromagnetic waves with frequencies D1, D2.

In FIG. 13, each master makes an arbitration request to arbiter 102 when it requests an access to a particular slave. For the convenience of explanation, a master having made an arbitration request to arbiter 102 is referred to as master A, and a slave that master A wishes to access is referred to as slave A. Arbiter 102 notifies master A of inhibition of access to slave A in either of the following cases:

(a) Slave A is communicating with another master.

(b) Arbiter 102 also receives an access request to slave A from another master at the same time while salve A is not communicating with any master, and gives access permission to the other master as a result of the arbitration.

Arbiter 102 notifies master A of access permission in either of the following cases:

(c) Only master A is requesting an access to slave A while slave A is not communicating with any other master.

(d) Arbiter 102 also receives an access request to slave A from another master at the same time while salve A is not communicating with any master, and gives access permission to master A as a result of the arbitration.

Upon receipt of a notice of access permission from arbiter 102, master A starts to communicate with slave A at the predetermined frequency, and notifies arbiter 102 of completion of the communications as soon as the communications end.

Figure 14:
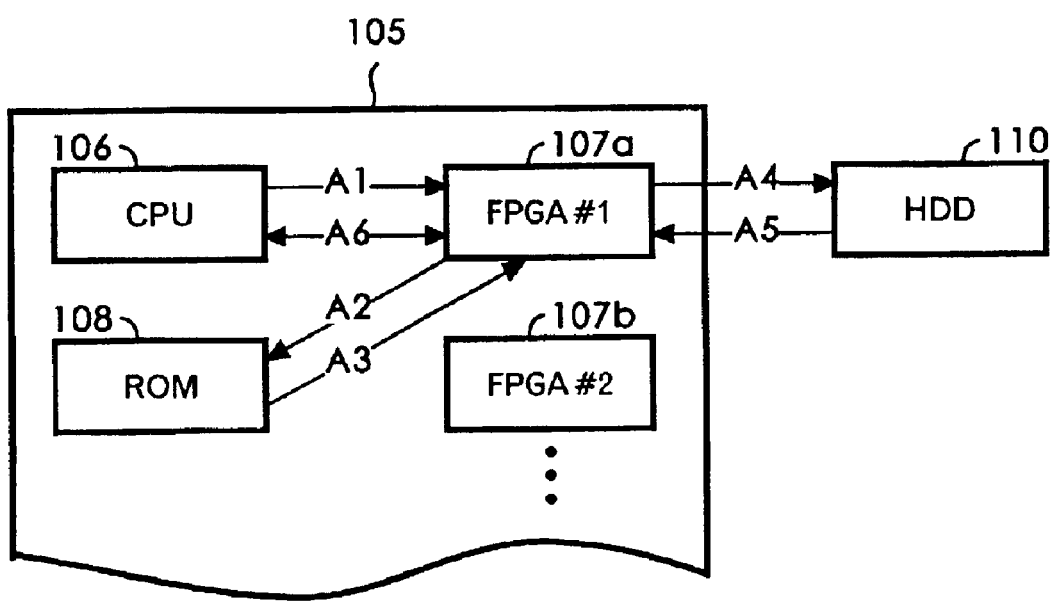
FIG. 14 illustrates an arrangement of a computer system using wireless communications for transmission and reception of data between IC modules.

FIG. 14 illustrates an arrangement of a computer system using wireless communications for transmission and reception of data between IC modules. One or more FPGA (Field Programmable Gate Array) modules 107a, 107b, are mounted on a substrate 105 together with a CPU module 106 and a ROM module 108 in which each of the CPU module 106, the FPGA modules 107a, 107b, and the ROM module 108 is an IC module containing an IC chip with wireless communications capability. FPGA module 107a is allowed to transmit/receive data to/from an HDD 110 external to substrate 105 via the IC chip with wireless communications capability by using a predetermined interface program. ROM module 108 stores interface programs to allow FPGA modules 107a, 107b, to function as interfaces between CPU module 106 and respective peripherals, that is, HDD 110 and other peripherals. A processing procedure for reading data from HDD 110 by CPU module 106 will next be described on the assumption that HDD 110 is newly added in the change of peripheral configuration including addition and deletion of peripherals.

A1: CPU module 106 requests FPGA module 107a to read data from HDD 110.

A2: Since HDD 110 is newly added and, therefore, FPGA module 107a does not have an IDE I/F (interface) for transmitting/receiving data to/from HDD 110, FPGA module 107a requests ROM module 108 to send a program (also referred to as code) to construct the IDE I/F for transmission/ reception of data to/from HDD 110.

A3: ROM module 108 transmits FPGA module 107a the code requested by FPGA module 107a. Then, FPGA module 107a constructs the IDE I/F for HDD 110 based on the code received from ROM module 108.

A4: FPGA module 107a makes a request of data readout to HDD 110.

A5: HDD 110 transmits the requested data to FPGA module 107a.

A6: FPGA module 107a transmits the data to CPU module 106.

The system of FIG. 14 can cope well with the change of peripheral configuration without changing the substrate and replacing cables. When an EEPROM (Electrically Erasable Programmable Read-Only Memory) is used instead of ROM module 108, the system can cope well with any change in the standards such as revision of the IDE or USB standard, or establishment of new standards after the computer system is installed. In other words, when the I/F is revised, or a new standard is established, a supplier's operator writes an appropriate code into the EEPROM, and forces FPGA module 107a to read out the interface code for the revised or new standard.

The system of FIG. 14 can also cope well with a failure of FPGA module 107a appropriately. CPU module 106 determines that a failure has occurred in FPGA module 107a when no data is received from FPGA module 107a within a predetermined time despite a data request to FPGA module 107a. Then, CPU module 106 requests FPGA module 107b to read data from HDD 110, instead of FPGA module 107a. In response to the data request from CPU module 106, FPGA module 107b follows the same processing procedure steps A1 through A6 described above with respect to FPGA module 107a, and transmits data read out from HDD 110 to CPU module 106.

Thus, according to the invention, it is possible to reduce the size of the IC chip significantly and heighten a degree of freedom as to the arrangement or positioning of the IC chips on the substrate, by forming the wireless communications input/output section within the IC chip together with the logic section to perform data input and output between the IC chips via the respective wireless communications input/output sections.

While there have been shown and described what are at present the preferred embodiments of the invention, it will be obvious to those skilled in the art that various changes and modifications may be made therein without departing from the scope of the invention as defined by the appended claims.

What is claimed is:

1. A data processing system comprising first, second, third, and fourth IC chips;
each of said IC chips comprising:
logic circuitry; and
wireless communications input/output circuitry, electrically coupled to said logic circuitry, for performing wireless input and output communications with the other IC chips; and wherein
said first IC chip is a master, said second IC chip is a master, said third IC chip is
a slave and said fourth IC chip is an arbiter;
each of said masters includes means for making an arbitration request to said arbiter to obtain permission to communicate wirelessly with said slave;
said arbiter including means for ranting said permission for one of said masters to communicate wirelessly with said slave if no other master currently has permission to communicate wirelessly with said slave.

2. The data processing system according to claim 1, wherein each of said IC chips performs all input and output communication via said wireless communications input/output circuitry.

3. The data processing system according to claim 1, further including a plurality of IC modules mounted on a single substrate, each of said IC modules including a respective one of said IC chips.

4. The data processing system according to claim 3, wherein said plurality of IC modules are mounted on one surface or both surfaces of said single substrate, and said substrate contains only power supply and ground layers as wiring layers.

5. The data processing system according to claim 1, further including a plurality of IC modules, each of said IC modules mounted on separate substrates, respectively, each of said IC modules including a respective one of said IC chips.

6. The data processing system according to claim 1, further including a plurality of IC modules installed in a single computer, each IC module including a respective one of said IC chips.

7. The data processing system according to claim 1, wherein at least one of said IC chips includes wired communications input/output circuitry for performing wired input and output communication with selected ones of the other IC chips.

8. The data processing system according to claim 1, wherein said IC chips use electromagnetic waves for said wireless communication.

9. The data processing system according to claim 1, further including a plurality of IC modules accommodated in a common electromagnetic shield space, each of said IC modules including a respective one of said IC chips.

10. The data processing system according to claim 1, wherein each of said IC chips include means for transmitting and receiving RF electromagnetic waves, infrared rays, and/or laser beams.

11. The data processing system according to claim 1, further comprising a fifth, slave IC chip, and wherein said first and third IC chips communicate with each other using electromagnetic waves of one frequency, and concurrently said second and fifth IC chips communicate with each other using electromagnetic waves of a different frequency.

12. The data processing system according to claim 11, wherein said arbiter includes means for assigning frequencies of electromagnetic waves used when said IC chips communicate with one another via their respective wireless communications input/output circuitry.

13. The data processing system according to claim 1, wherein at least one of said IC chips includes an antenna connected to said wireless communications input/output circuitry.

14. The data processing system according to claim 13, further including a substrate and a module having said at least one of said IC chips therein, said antenna being formed along a side edge of said IC chip, and said module being mounted on said substrate by a flip-chip BGA technique.

15. The data processing system according to claim 1, further including a package having one of said IC chips therein and an antenna connected to said wireless communications input/output circuitry so as to protrude from said package in an exposed state.

16. The data processing system according to claim 1, further including a module having at least one of said IC chips therein and including an antenna pad connected to the wireless communications input/output circuitry for said one IC chip, said system further including a substrate having an antenna standing upright and fixed to said substrate, said module including said one IC chip mounted on said substrate.

17. The data processing system according to claim 1, wherein said plurality of IC chips include a program memory IC chip storing various programs and a program executing IC chip capable of rewriting said programs.

18. The data processing system according to claim 17, wherein said program memory IC chip stores programs that can be read out for executing interface functions between a CPU and respective peripherals, and said program executing IC chip performs data input and output with said peripherals by wireless communications and loads said program for executing the interface function between the CPU and the peripheral from said program memory chip.

19. A data processing system comprising a plurality of IC chips with wireless communications capability, each of which includes wireless communications input/output structure for performing wireless data input and output and is allowed input and output data with one another via said wireless communications input/output structure; and wherein said plurality of IC chips with wireless communications capability include a plurality of masters, at least one slave, and an arbiter, and each of said masters makes an arbitration request to said arbiter for data communications with said slave prior to said data communications.

20. The data processing system according to claim 19, wherein each of said masters is assigned with a unique frequency, and communicates with said arbiter by using an electromagnetic wave with said unique frequency.

21. The data processing system according to claim 20, wherein a master-slave frequency is set, and each of said masters is allowed to communicate with a desired slave by using an electromagnetic wave with said master-slave frequency.

22. The data processing system according to claim 21, wherein a plurality of different master-slave frequencies are set, and a plurality of master-slave pairs are allowed to communicate simultaneously by using electromagnetic waves with the respective master-slave frequencies.

23. The data processing system according to claim 21, wherein said master-slave frequency is assigned as a master-unique frequency or a slave-unique frequency.

24. A data processing method comprising the steps of:
preparing a plurality of IC chips with wireless communications capability each including wireless communications input/output structure for performing data input and output; and
allowing said plurality of IC chips with wireless communications capability to input and output data with one another via said wireless communications input/output structure; and
wherein, upon performing said data input and output between said IC chips with wireless communications capability via said wireless communications input/output structure, said plurality of IC chips with wireless communications capability are classified into a plurality of masters, at least one slave, and an arbiter, and each of said masters makes an arbitration request to said arbiter for data communications with said slave prior to said communications.

* * * * *